March 16, 1965 J. T. LAW 3,173,814
METHOD OF CONTROLLED DOPING IN AN EPITAXIAL VAPOR
DEPOSITION PROCESS USING A DILUENT GAS
Filed Jan. 24, 1962 3 Sheets-Sheet 1

INVENTOR.
John Trevor Law
BY
Mueller & Aichele
ATT'YS.

METHOD OF CONTROLLED DOPING IN AN EPITAXIAL VAPOR DEPOSITION PROCESS USING A DILUENT GAS

Filed Jan. 24, 1962 3 Sheets-Sheet 2

INVENTOR.
John Trevor Law
BY Mueller & Aichele
ATT'YS

March 16, 1965 J. T. LAW 3,173,814

METHOD OF CONTROLLED DOPING IN AN EPITAXIAL VAPOR DEPOSITION PROCESS USING A DILUENT GAS

Filed Jan. 24, 1962 3 Sheets-Sheet 3

INVENTOR.
John Trevor Law

BY Mueller & Aichele

ATT'YS.

United States Patent Office 3,173,814
Patented Mar. 16, 1965

3,173,814

METHOD OF CONTROLLED DOPING IN AN EPITAXIAL VAPOR DEPOSITION PROCESS USING A DILUENT GAS

John Trevor Law, Scottsdale, Ariz., assignor to Motorola, Inc., Chicago, Ill., a corporation of Illinois Filed Jan. 24, 1962, Ser. No. 168,425
3 Claims. (Cl. 148—175)

This invention relates generally to the semiconductor art. In particular, the invention relates to a process for forming epitaxial films or layers of semiconductor material on a substrate crystal from vapors which react or decompose to deposit elemental semiconductor material on the substrate, and of controlling the conductivity value and conductivity type of such epitaxial films by adding impurities to the reacting vapors from a gaseous source of impurity material.

Epitaxial material, as that term is used herein, means monocrystalline material whose crystallographic orientation is determined by a substrate on which it is formed. The process by which epitaxial material is formed is known as epitaxial growth, or sometimes as epitaxis. At least one crystallographic plane of the substrate crystal has the same crystallographic orientation and lattice constants as the desired epitaxial layer, and the epitaxial layer is grown on a surface parallel to that plane. The material of the epitaxial layer and the substrate may be the same, although this is not essential.

Alloying, diffusion, and epitaxial growth are alternative processes for forming semiconductor junctions. In alloying processing and diffusion procesing, impurities are introduced into a substrate crystal to form a junction within the substrate. It is necessary to add sufficient impurity material to compensate that already present in the substrate, and also to add an additional amount to produce an oppositely doped layer. It is often necessary to make the net doping level in such a doped layer quite low compared to the initial doping level of the substrate material in which the layer is formed. Thus, a relatively large amount of doping impurity material is introduced into the substrate to compensate the initial doping and produce a slight net doping. This means that it is necessary to control accurately a small difference between two larger amounts of impurities, and even with the refined control techniques that are available in the present state of the semiconductor art, it is difficult to obtain the desired net doping on a consistently reproducible basis.

Epitaxial growth as a method of forming junctions does not have these inherent limitations. In epitaxial growth, new semiconductor material is deposited in monocrystalline form on a substrate. Consequently, the epitaxial material can be doped while it is deposited without having to compensate impurities already present in the substrate material. If the amount of impurity material that is added during the deposition stage can be controlled accurately, it should be possible to control the resistivity of an epitaxial layer more accurately than that of a diffused or alloyed region.

Although these and other advantages of epitaxial growth have been recognized, many practical problems have been encountered in attempting to control the amount of impurity that is added to the reacting vapors with the desired degree of accuracy and reproducibility. This is understandable when one considers that for typical doping levels, the ratio of semiconductor atoms to impurity atoms in an epitaxial layer is roughly 10 million to 1. In the vapor phase, the ratio of impurity material to semiconductor material must be only a few parts per million, and this gas ratio must be maintained within a narrow range of values in order to achieve accurate control of the doping level in the epitaxial material.

Up to the present time, the impurities have usually been introduced from a liquid source. The simplest method is to add the desired impurity directly to a liquid source of semiconductor material. For example, liquid boron trichloride or phosphorous trichloride can be added to liquid silicon tetrachloride, and vapors from this liquid mixture can be introduced into a carrier gas such as hydrogen. A disadvantage of this approach is that it is not possible to vary from one run (or series of runs) to another the resistivity and conductivity type of the epitaxial material which results from the vapor phase reaction, unless several such liquid sources are used and each one is tailored to produce a layer of a given resistivity and type. Also, the composition of the liquid changes as the liquid is used up, and therefore the partial pressure of the doping impurity changes with time.

A potentially more versatile method involves separate sources of liquid semiconductor materials and liquid doping materials. For example, separate liquid sources of silicon tetrachloride, boron trichloride and phosphorous trichloride can be provided, and controlled amounts of the vapors from these sources can be mixed before introducing them into the reactor. A drawback of this approach is that the vapor pressure over the liquids is affected by several variables, and this makes it difficult to mix the vapors in exact proportions, particularly where such small amounts of impurity vapors are involved. Each liquid source is maintained at a constant temperature, and the temperatures are different. Controlling these temperatures with the required accuracy is a difficult problem.

The present invention provides a method of growing epitaxial layers from vapors and of doping those layers by adding impurities to the reacting vapors from a gaseous source. The gas in the source is preferably a hydride of the selected doping element. Examples are phosphorous hydride (phosphine), boron hydride (diborane) and arsenic hydride (arsine). The gaseous hydride material is diluted with gas such as hydrogen so that it can be handled safely. Controlled amounts of the hydride-hydrogen mixture are introduced into a main gas stream which bears the volatile compound of the semiconductor material which is to be deposited. By using a process which combines the impurity-bearing hydrogen gas stream with another hydrogen gas stream containing vapors of the semiconductor compound, it has been found that at the present state of development, the doping level of the resulting epitaxial material can be controlled at a selected value with a variation of no more than ten percent from that value.

A significant advantage of doping by injecting impurities from a gaseous source is that the injection rate can be varied continuously so as to form films with graded doping. At the present time, layers with graded doping cannot be grown in a practical way by doping from a liquid source. By using a system in which impurities are injected from a gaseous source, it is possible to provide an automatically controlled system for growing multiple layer structures, whereas such an automatic system is less practical if impurities are injected from a liquid source.

The invention will be described with reference to the accompanying drawings, in which.

Figure 1:
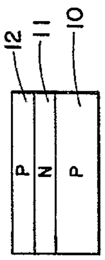
FIG. 1 is a schematic view on an exaggerated scale which illustrates a PNP semiconductor unit having epitaxial layers.
Figure 2:
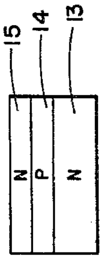
FIG. 2 is a view similar to FIG. 1 showing an NPN semiconductor unit of the epitaxial type.

Typical semiconductor junction units in which the junctions are formed by doped epitaxial material are illustrated on a greatly exaggerated scale in FIGS. 1 and 2. The layer combinations of these units are examples of a wide variety of layer combinations which can be fabricated using the process of the invention. In FIG. 1, the substrate 10 is a monocrystalline element of P-type semiconductor material. The epitaxial layer 11 is of the same semiconductor material as the substrate, but is doped with a donor impurity which imparts N-type conductivity to it. The other epitaxial layer 12 is of the same semiconductor material doped with an acceptor impurity which gives it P-type conductivity. Thus, the unit of FIG. 1 has a PNP structure of the type used in transistor devices. FIG. 2 shows a unit having an NPN structure in which the epitaxial layer 14 is doped with an acceptor impurity and the epitaxial layer 15 is doped with a donor impurity. The substrate 13 also contains a donor impurity. Thus, the junction unit of FIG. 2 is simply the complement of that shown in FIG. 1.

Usually, the semiconductor material of the junction unit is either silicon or germanium. As is known in the art, the elements boron, aluminum, gallium, and indium, which are in Group III*a* of the Periodic Table, are suitable accept or type doping impurities for silicon and germanium. The elements phosphorus, arsenic and antimony, which are in Group V*a* of the Periodic Table, are suitable donor impurities for silicon and germanium. As previously mentioned, doping is accomplished in accordance with the present invention by introducing the selected impurity into the reaction system in the form of a gaseous hydride. Of the impurities listed above, the gaseous hydrides of only boron, phosphorus and arsenic are available commercially at the present time, and the manner in which doping is accomplished using these hydrides will be described herein. However, as hydrides of other doping impurities become available in gaseous form, they may be used in practicing the invention. Also, volatile compounds of the abovenamed impurity elements other than hydrides may be used provided that they can be diluted with a carrier gas such as hydrogen to give a stable mixture which can be injected into the main gas stream in controlled amounts. Examples of such volatile compounds are $BCl_3$, $BBr_3$, $AsCl_3$, and $SbCl_5$.

Figure 3:
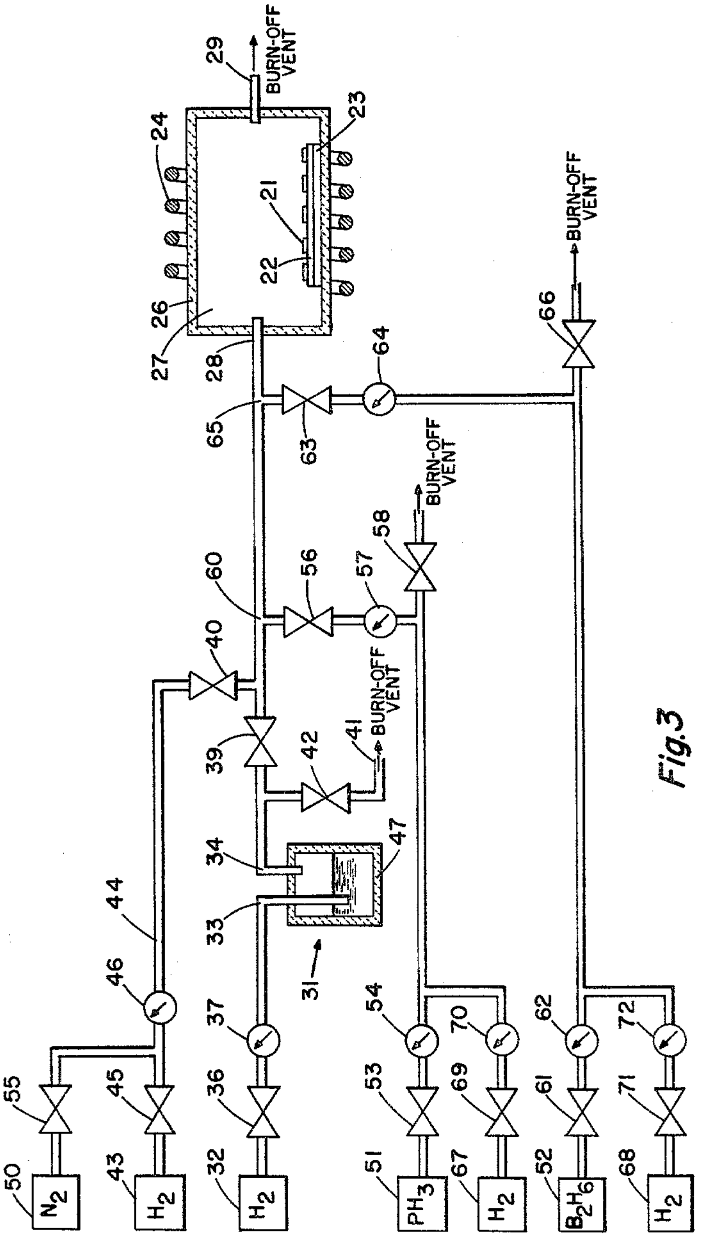
FIG. 3 is a flow diagram of a system for growing and doping epitaxial layers such as those included in the units of FIGS. 1 and 2.

A suitable system for growing and doping epitaxial layers is shown in FIG. 3. The substrate material is ordinarily provided in the form of wafers 21 which are placed on a slab 22 of quartz carried on a susceptor 23 of graphite or molybdenum. The upper face of each wafer is parallel to a selected crystallographic plane of the wafers, such as that identified by Miller Indicies (1, 1, 1). The susceptor 23 is heated by an induction heating coil 24 which is located on the outside of a quartz tube 26 which forms the reaction chamber 27. The vapors which react to deposit elemental semiconductor material and doping material on the wafers 21 are carried in hydrogen gas which is introduced into the reaction chamber through the inlet 28. Hydrogen gas carrying the byproducts of the reaction which takes place in the chamber 27 leaves the chamber through an outlet 29 and is burned off. Before introducing hydrogen into the reaction chamber, it is flushed out with nitrogen supplied from a source 50 through a valve 55. The temperature within the reaction chamber may be measured using an optical pyrometer which is not shown.

Vapors of a volatile compound of silicon or germanium are obtained from a saturator 31. The saturator 31 contains the semiconductor compound in liquid form, and hydrogen gas from a source 32 is passed through the liquid semiconductor compound by means of suitable piping lines 33 and 34. The flow rate of the incoming hydrogen is controlled by a valve 36 and is measured by a meter 37. The outlet line 34 from the saturator 31 leads to the inlet 28 of the reaction chamber through a valve 39. When the valve 39 is closed, the gases may be passed to a burn-off vent through a piping line 41 which contains a valve 42. The partial pressure ratio of hydrogen to semiconductor vapors may be controlled accurately by diluting the outgoing gas from the saturator with hydrogen supplied from another hydrogen source 43 through the piping line 44 which connects into line 34. Line 44 has a valve 45 and a meter 46 for controlling and measuring the flow rate of the hydrogen gas. Another valve 40 is provided ahead of the point where line 44 joins line 34.

Examples of liquid compounds of germanium and silicon which may be provided in the saturator 31 are silicon tetrachloride, germanium tetrachloride and thichlorsilane. Other halides and hydrogen-halides of silicon and germanium are available and may be used, but the best results have been obtained with the tetrachloride and trichlorsilane compounds. The vapor pressure over the liquid in the saturator 31 is kept constant by providing a constant temperature liquid such as ice-water in a jacket 47 surrounding the saturator. The ratio of the partial pressure of hydrogen to the partial pressure of the vapors of the volatile semiconductor compound is established at a value greater than about 65 to 1. The flow rates of hydrogen in lines 33 and 44 may be in the range from about 10 cubic centimeters per minute to about 20 liters per minute, with the ratio of flows being established in the range from 10:1 to 200:1. The larger flow rate is in line 44.

The hydrogen gas, saturated with vapors of the liquid semiconductor compound, passes over the surface of the heated wafers 21. A heterogeneous reaction takes place at the wafer surfaces, and a film or layer of either germanium or silicon, as the case may be, grows in monocrystalline form on the wafer. For a silicon substrate, the temperature in the reaction chamber as measured with an optical pyrometer is maintained in the range from about 1000° C. to about 1300° C., and preferably at 1130–1200° C. For germanium, the temperature in the reaction chamber as measured with an optical pyrometer is maintained within a range from 700° C. to 850° C., and preferably at about 750–800° C. If no doping impurities are added to the mixture of hydrogen and vapors from the saturator 31, an undoped epitaxial film is deposited on each of the wafers 21. A film grown from undoped vapors on a high resistivity substrate has a resistivity greater than 50 ohm-centimeters in the case of silicon and greater than 5 ohm-centimeters in the case of germanium.

In the system of FIG. 3, doping impurities are added to the gas-vapor mixture in piping line 34 in order to control the resistivity value and conductivity type of the film or films which are deposited on the wafers 21. In the particular system illustrated in FIG. 3, gaseous phosphine is supplied from a source 51 and gaseous diborane is supplied from another source 52. These materials are difficult to handle in a concentrated form because they are explosive. The safety problem has been overcome by diluting the phosphine and diborane with hydrogen. The phosphine/hydrogen mixture and the diborane/hydrogen mixture can conveniently be provided in steel tanks of the type used for welding gases. Good results have been obtained using 100 parts of the gaseous hydride per million parts of hydrogen in the tanks which provide the sources 51 and 52. In practice, concentrations in the range from 100 to 10,000 parts per million are preferred, but any concentration above 1 part million may be used provided that proper safety precautions are observed.

The phosphine/hydrogen mixture from source 51 is introduced into the system through a valve 53, and the flow rate is measured by a meter 54. The gases are introduced into the line 34 leading to the reaction chamber 27 through another valve 56 with an associated meter 57. The injection point is at 60. When the valve 56 is closed, the gases may be passed through a valve 58 to a burn-off vent. The piping for introducing diborane into the system from the source 52 is similar. The flow of the diborane/hydrogen mixture is controlled by a valve 61 and is measured by a meter 62. The gases flow through another valve 63 and a meter 64, and are introduced into line 34 at an injection point 65. There is a valve 66 for permitting the gases to pass to a burn-off vent when desired.

Hydrogen has been used as the diluent for the hydride impurity material because the carrier gas for the vapors of the semiconductor compound which are introduced from the saturator 31 is preferably hydrogen. If a different carrier gas is used, the same gas may be used as the diluent for the hydride material. It has been found, however, that unusually uniform doping from wafer to wafer is obtained by using hydrogen as the diluent and as the carrier gas. This results in an excess of hydrogen being present in the reaction chamber 27 which tends to make the decomposition reaction of the hydride compound an inefficient reaction. Consequently, not all of the hydride is decomposed as it passes over the wafer located nearest to the inlet 28, and this ensures that all of the wafers spaced along the path of gas flow in the reaction chamber are exposed to a substantially uniform concentration of hydride material. The decomposition reactions involved are as followes:

$$B_2H_6 \rightleftharpoons 2B + 3H_2$$

$$PH_3 \rightleftharpoons P + \frac{3}{2}H_2$$

$$AsH_3 \rightleftharpoons As + \frac{3}{2}H_2$$

The excess of hydrogen in the reaction chamber tends to drive these decomposition reactions backwards and thus makes the reactions relatively inefficient. The decomposition reaction of the silicon tetrachloride, germanium tetrachloride or trichlorsilane, as the case may be, is also made relatively inefficient by using a very dilute mixture of the volatile compound and hydrogen as described above, and by proper selection of the temperature conditions, flow rates and other variables. Consequently, the epitaxial films which grow on the wafers 21 are more likely to be uniform in thickness and in other respects than would be the case if the conditions were set to make the decomposition reactions as efficient as possible.

It has been found that the resistitvity value of doped epitaxial films grown in the system of FIG. 3 in accordance with the previous description may be controlled over a relatively wide range of values. For example, epitaxial films of silicon grown from vapors of silicon tetrachloride or trichlorsilane doped from a source having either a phosphine/hydrogen ratio of 100 parts per million or a diborane/hydrogen ratio of 100 parts per million may be controlled effectively over the range from .001 ohm-centimeter to .1 ohm-centimeter. Similarly, using germanium tetrachloride and either $PH_3$ or $B_2H_6$ diluted with $H_2$ to provide a concentration of 100 p.p.m. the resistivity of the epitaxial film may be controlled in the range from .005 to .1 ohm-centimeter.

In order to obtain doped epitaxial films with higher resistivity values, it has been found to be desirable to further dilute the phosphine and diborane gases before supplying them to the reaction chamber. This is accomplished by adding hydrogen from dilution sources 67 and 68 to the phosphite/hydrogen or the diborane/hydrogen mixture as the case may be. A valve 69 and a meter 70 is provided in the piping line leading from the dilution source 67 and another valve 71 and an associated meter 72 is provided in the line leading from the other dilution source 68. By further diluting the phosphine or diborane with hydrogen from the dilution sources, the resistivity value of epitaxial films has been controlled successfully within the range from .1 ohm-centimeter to 5 ohm-centimeters. The dilution sources 67 and 68 may contain some phosphine or diborane if desired. The concentration of phosphine and diborane in sources 67 and 68 respectively should be considerably less than the corresponding concentrations in the main impurity sources 51 and 52.

Figure 4:
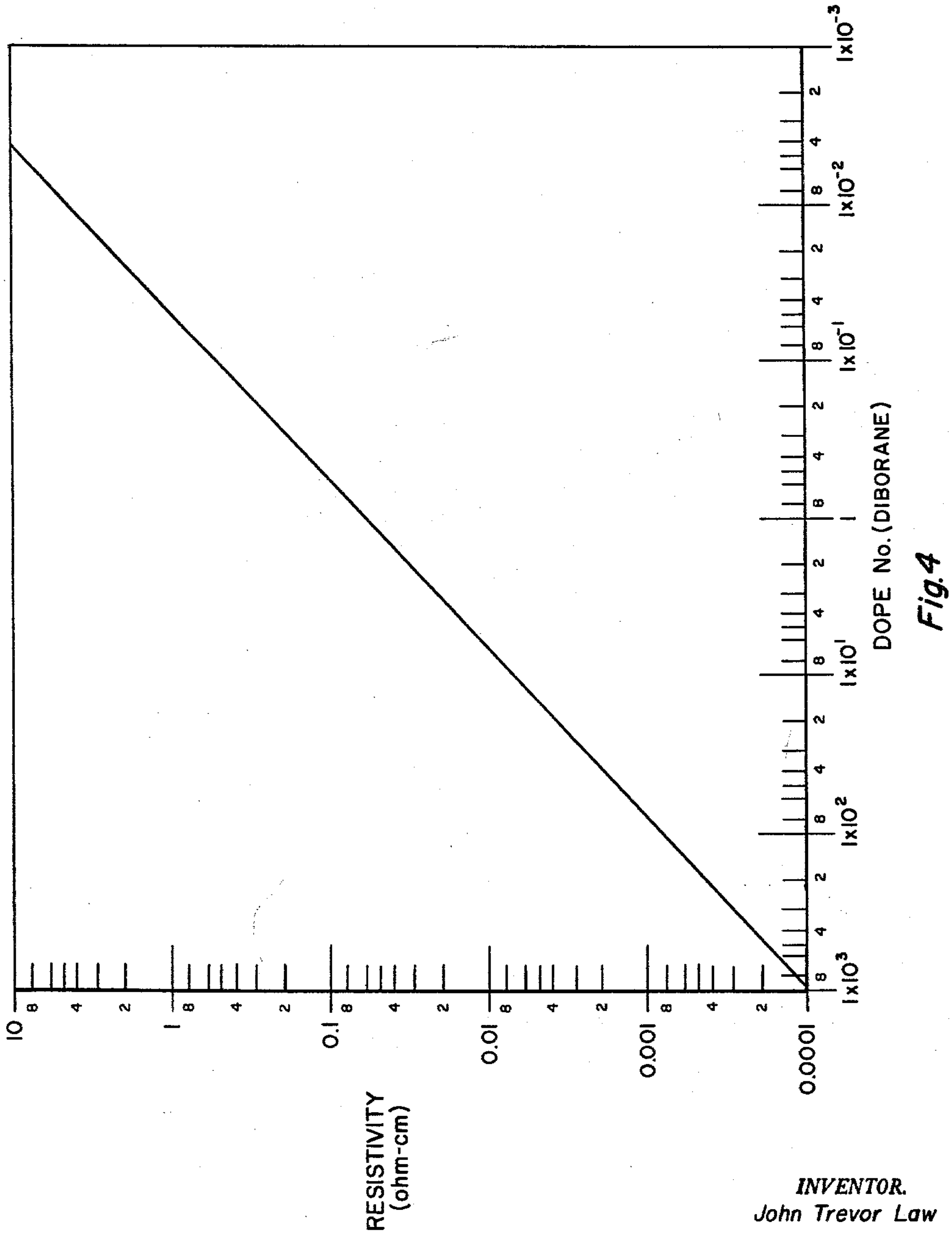
FIG. 4 is a curve plotted on a logarithmic scale which illustrates how the doping of epitaxial silicon with boron obtained from diborane gas can be controlled.
Figure 5:
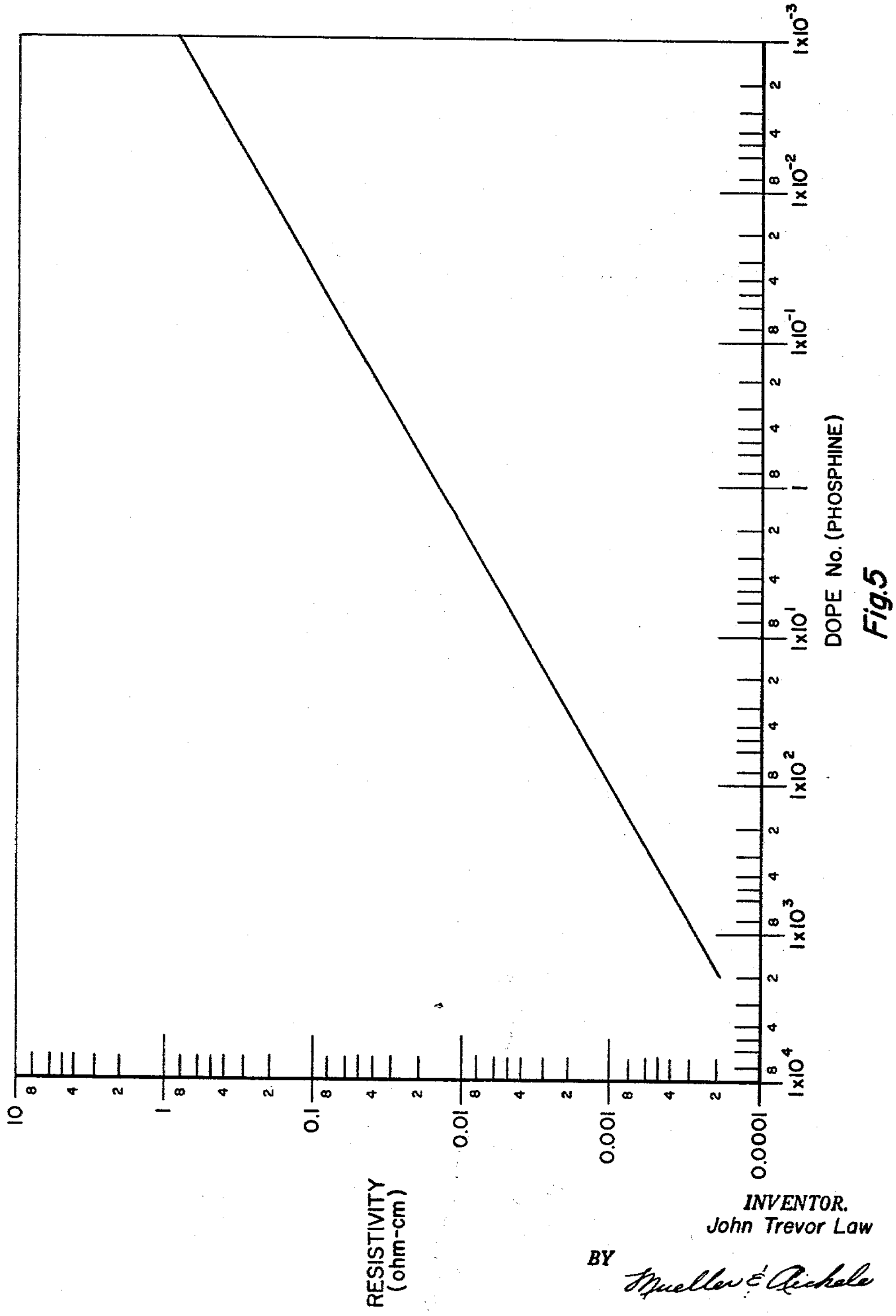
FIG. 5 is a curve similar to that of FIG. 4 for the doping of silicon epitaxial material with phosphorus obtained from phosphine gas.

FIGS. 4 and 5 are curves on a logarithmic scale which illustrate how the doping of epitaxial films may be controlled within the ranges just referred to. FIG. 4 is for silicon epitaxial films grown from silicon tetrachloride vapors doped with diborane, and FIG. 5 is for silicon epitaxial films grown from silicon tetrachloride doped with phosphine. In order to grow an epitaxial film having a selected doping level, the flow rate of the phosphine or diborane material, as the case may be, is simply set at a corresponding level obtained from the appropriate curve.

These curves, and other experimental data, indicate that the concentration of doping impurity material in an epitaxial layer that is grown and doped by the process of the invention is directly dependent on the impurity-to-semiconductor ratio in the gas phase. For example, using phosphine, diborane, and silicon tetrachloride in the system of FIG. 3 in the manner previously explained, the gas phase ratios of boron to silicon and of phosphorus to silicon can be described mathmematically in terms of flow rates as follows:

$$\frac{P}{Si}\text{ ratio}=\frac{TIC}{D\left(\frac{S}{3}\right)}=\frac{3TIC}{DS}$$

$$\frac{B}{Si}\text{ ratio}=\frac{2TIC}{D\left(\frac{S}{3}\right)}=\frac{6TIC}{DS}$$

Where:

$T$=flow rate of the gas stream flowing from the tank containing the impurity material (51 or 52).
$I$=flow rate of the injection gas stream as injected at point 60 or 65.
$D$=flow rate of the dilution gas stream from the dilution source 67 or 68.
$S$=flow rate of the silicon-bearing gas stream in line 34 at the injection point (60 or 65).
$C$=concentration of phosphine or diborane in the respective source (51 or 52).
$S/3$=approximate flow rate of $SiCl_4$ vapors at the injection point, assuming that the stream S is saturated with $SiCl_4$ at room temperature.

The factor $TI/DS$ which appears in these formulas will be referred to herein as the "dope number." The curves of FIGS. 4 and 5 were obtained by plotting dope numbers vs. resistivity values for a large number of silicon epitaxial layers grown in the system of FIG. 3 with the same operating temperatures and using the same source materials for all runs so that the concentration factor C in the above formulas was a constant. Corresponding curves may be obtained for any given value of C, and such curves would be parallel to those of FIGS. 4 and 5.

It may be seen from the curves that the impurity-to-semiconductor ratio in the composite gas stream supplied to the reaction chamber is always kept relatively low, and that the resistivity of the epitaxial layer is directly related to the impurity-to-semiconductor ratio. If that ratio is kept constant during a given run, the epitaxial layer has substantially uniform doping. However, the impurity-to-semiconductor ratio may be varied continuously by varying any or all of the flow rates T, I, D and S. The overall effect is to vary the injection gas stream relative to the semiconductor-bearing gas stream S.

The gaseous hydride compounds of doping impurity materials have several advantages for epitaxial growth applications as compared to other compounds. For example, phosphine and diborane are much less corrosive than the halides of phosphorus and boron, and the hydrides are less sensitive to moisture which may be present in the lines of the system than the halides. This means that by using the hydrides, the system can be operated over longer periods of time with less maintenance and with higher yields of acceptable epitaxial films than can be achieved using halides of the impurity materials. Phosphine, diborane and arsine diluted with hydrogen may be obtained commercially in containers which may be connected into the system of FIG. 3 conveniently, and gases having a high degree of purity are available. Using the process of the invention, it has been possible to achieve a very high degree of control over the resistivity value of the resulting doped epitaxial films. It has been possible to grow epitaxial films of silicon and germanium with a selected resistivity value up to about 1 ohm-centimeter with a maximum variation of 5 percent from that value. For resistivities of from 1 to 5 ohm-centimeters, the maximum variation has been 10 percent from the selected value. These are not necessarily the best results which can be obtained, but they do illustrate the improved doping control which has been achieved up to the present time.

I claim:

1. The process of depositing a monocrystalline semiconductor film from a gas stream and of doping the film by controlled addition to the gas stream of an impurity compound which is wholly gaseous at normal room temperature, said process including the steps of:

passing over a crystal element of the semiconductor material a main stream of carrier gas, injecting into said main gas stream a gaseous compound of said semiconductor material from which semiconductor material deposits on said crystal element at a temperature above 600° C., withdrawing a mixture of a diluent gas and a normally gaseous hydride compound of a doping impurity from a source container in which said hydride compound is wholly gaseous and is diluted by said diluent gas to a predetermined low concentration, injecting said mixture into a stream of diluent gas to form a diluted doping gas stream, injecting mixed gases from said diluted doping gas stream into said main gas stream at a rate regulated to control the impurity content of the final semiconductor film, and subjecting said crystal element to a temperature below the melting point of said semiconductor material but sufficiently above 600° C. to cause simultaneous deposition of semiconductor material and impurity material from said main gas stream on to said crystal element to thereby form a doped semiconductor film on said crystal element which extends the crystal structure thereof.

2. The process of depositing a monocrystalline semiconductor film from a gas stream and of doping the film by controlled addition of an impurity compound to the gas stream from a wholly gaseous source, said process including the steps of:

passing over a crystal element of the semiconductor material a main gas stream of hydrogen, injecting into said main gas stream a gaseous halide compound of said semiconductor material from which semiconductor material deposits on said crystal element by a heterogeneous reaction of said halide compound with hydrogen at a temperature above 600° C., withdrawing a mixture of hydrogen and a hydride compound of a doping impurity which is wholly gaseous at room temperature from a source container in which said hydride compound is wholly gaseous with said mixture forming a doping gas stream, injecting mixed gases from said doping gas stream into said main gas stream at a rate regulated to control the impurity content of the final semiconductor film, and subjecting said crystal element to a temperature below the melting point of said semiconductor material but enough above 600° C. to cause simultaneous deposition of semiconductor material and impurity material from said main gas stream on to said crystal element to thereby form a doped semiconductor film on said crystal element which continues and extends the crystal structure thereof.

3. The process of depositing a monocrystalline semiconductor film from a gas stream and of doping the film by controlled addition to the gas stream of an impurity compound which is wholly gaseous at normal room temperature, said process including the steps of:

passing over a crystal element of the semiconductor material a main stream of hydrogen, injecting into said main gas stream a gaseous halide compound of said semiconductor material from which semiconductor material deposits on said crystal element at a temperature above 600° C., withdrawing a mixture of hydrogen and a normally gaseous hydride compound of a doping impurity from a source container in which said hydride compound is wholly gaseous and is diluted with hydrogen to a predetermined low concentration, injecting said mixture into a stream of hydrogen to form a diluted doping gas stream, injecting a dilute mixture of said hydride compound and hydrogen from said doping gas stream into said main gas stream at a rate regulated to control the impurity content of the final semiconductor film, and subjecting said crystal element to a temperature below the melting point of said semiconductor material but sufficiently above 600° C. to cause simultaneous deposition of semiconductor material and impurity material from said main gas stream on to said crystal element to thereby form a doped semiconductor film on said crystal element which continues and extends the crystal structure of said element.

References Cited in the file of this patent

UNITED STATES PATENTS

| | | |
|---|---|---|
| 2,780,569 | Hewlett | Feb. 5, 1957 |
| 2,895,858 | Sangster | July 21, 1959 |
| 2,910,394 | Scott et al. | Oct. 27, 1959 |
| 2,955,966 | Sterling | Oct. 11, 1960 |

FOREIGN PATENTS

| | | |
|---|---|---|
| 1,029,941 | Germany | May 14, 1958 |
| 598,322 | Canada | May 17, 1960 |

OTHER REFERENCES

Conference on the Metallurgy of Semiconductor Materials, at the Ambassador Hotel, Los Angeles, California, from August 30 to September 1, 1961.

Metallurgy of Semiconductor Materials, volume 15, 1962, Interscience Publishers, New York.